(12) United States Patent
Bhuyan et al.

(10) Patent No.: US 11,371,136 B2
(45) Date of Patent: Jun. 28, 2022

(54) METHODS FOR SELECTIVE DEPOSITION OF DIELECTRIC ON SILICON OXIDE

(71) Applicant: Applied Materials, Inc., Santa Clara, CA (US)

(72) Inventors: Bhaskar Jyoti Bhuyan, San Jose, CA (US); Mark Saly, Santa Clara, CA (US); David Thompson, San Jose, CA (US); Lakmal C. Kalutarage, San Jose, CA (US); Rana Howlader, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 183 days.

(21) Appl. No.: 16/647,794

(22) PCT Filed: Sep. 19, 2018

(86) PCT No.: PCT/US2018/051749
§ 371 (c)(1),
(2) Date: Mar. 16, 2020

(87) PCT Pub. No.: WO2019/060413
PCT Pub. Date: Mar. 28, 2019

(65) Prior Publication Data
US 2020/0216949 A1    Jul. 9, 2020

Related U.S. Application Data

(60) Provisional application No. 62/560,441, filed on Sep. 19, 2017.

(51) Int. Cl.
*H01L 21/31* (2006.01)
*C23C 16/04* (2006.01)
(Continued)

(52) U.S. Cl.
CPC ........... *C23C 16/04* (2013.01); *C23C 16/455* (2013.01); *H01L 21/02271* (2013.01); *H01L 21/02315* (2013.01)

(58) Field of Classification Search
CPC .......... H01L 21/0228; H01L 21/02271; H01L 21/02315; H01L 21/3105; H01L 21/32;
(Continued)

(56) References Cited

U.S. PATENT DOCUMENTS

| 4,981,724 A | 1/1991 | Hochberg et al. |
| 2010/0247803 A1 | 9/2010 | Lee et al. |
| 2019/0080904 A1* | 3/2019 | Anthis ................ H01L 21/3105 |

FOREIGN PATENT DOCUMENTS

| JP | H0245490 A | 2/1990 |
| JP | 2002521531 A | 7/2002 |

(Continued)

OTHER PUBLICATIONS

Machine Translation of JP2012153638, 13 pages.
(Continued)

*Primary Examiner* — Brook Kebede
(74) *Attorney, Agent, or Firm* — Servilla Whitney LLC

(57) ABSTRACT

Methods of depositing a film selectively onto a first substrate surface relative to a second substrate surface are described. The methods include exposing a substrate to a blocking molecule to selectively deposit a blocking layer on the first surface. The blocking layer is exposed to a polymer initiator to form a networked blocking layer. A layer is selectively formed on the second surface. The blocking layer inhibits deposition on the first surface. The networked layer may then optionally be removed.

20 Claims, 7 Drawing Sheets

(51) Int. Cl.
   *C23C 16/455* (2006.01)
   *H01L 21/02* (2006.01)
(58) Field of Classification Search
   CPC . H01L 21/321; H01L 21/76879; C23C 16/04;
   C23C 16/455
   USPC .......................................................... 438/778
   See application file for complete search history.

(56) References Cited

FOREIGN PATENT DOCUMENTS

| | | | |
|---|---|---|---|
| JP | 2007514784 | A | 6/2007 |
| JP | 2010518644 | A | 5/2010 |
| JP | 2012153638 | A | 8/2012 |
| JP | 2016529303 | A | 9/2016 |
| KR | 20160130165 | A | 11/2016 |
| WO | 00/06610 | A2 | 2/2000 |
| WO | 2005066186 | A2 | 7/2005 |
| WO | 2008136882 | A2 | 11/2008 |
| WO | 2015036309 | A1 | 3/2015 |
| WO | 2017048911 | A1 | 3/2017 |
| WO | 2019226695 | A1 | 11/2019 |

OTHER PUBLICATIONS

Machine Translation of JPH0245490, 6 pages.
Buriak, Jillian M., "Organometallic Chemistry on Silicon and Germanium Surfaces", Chemical Reviews, vol. 102, No. 5, May 2002, 39 pages.

* cited by examiner

METHODS FOR SELECTIVE DEPOSITION OF DIELECTRIC ON SILICON OXIDE

CROSS-REFERENCE TO RELATED APPLICATIONS

This application is the National Stage entry of PCT/US2018/051749, filed on Sep. 19, 2018, which claims priority to U.S. Provisional Application Ser. No. 62/560,441, filed Sep. 19, 2017, the entire disclosures of which are hereby incorporated by reference herein.

FIELD

Embodiments of the disclosure generally relate to methods of selectively depositing a film on a dielectric surface using self-assembled monolayers to block other surfaces. Other embodiments of the disclosure are directed to methods for selective deposition of self-assembled monolayers through hydrosilylation of H terminated silicon surfaces.

BACKGROUND

The semiconductor industry faces many challenges in the pursuit of device miniaturization which involves rapid scaling of nanoscale features. Such challenges include the fabrication of complex devices, often using multiple lithography and etch steps. Furthermore, the semiconductor industry would like low cost alternatives to high cost EUV for patterning complex architectures. To maintain the cadence of device miniaturization and keep chip manufacturing costs down, selective deposition has shown promise. It has the potential to remove costly lithographic steps by simplifying integration schemes.

Selective deposition of materials can be accomplished in a variety of ways. For instance, some processes may have inherent selectivity to surfaces based on their surface chemistry. These processes are fairly rare and usually need to have surfaces with drastically different surface energies, such as metals and dielectrics.

In cases where surfaces are similar ($SiO_2$ versus Si—H term or SiN) the surfaces need to be selectively blocked by employing surface treatments that selectively react with one surface and not the other, effectively blocking any surface reactions during later ALD or CVD processes.

One of the most challenging selective growth processes is growth on dielectrics (low K, SiO, SiON, etc.) with no growth on Si (hydrogen terminated). The challenge stems from the inability to successfully react blocking molecules with a relatively strong silicon hydrogen bond. Enabling process flows to successfully block Si (H term) and not block the other dielectric surfaces has the potential to open up many integration schemes (selective caps, selective diffusion barriers, selective etch stops, self-alignment) to device manufacturers and therefore greatly advance progress in the field.

Therefore, there is a need in the art for a method of selectively depositing a variety of films on a dielectric (such as $SiO_2$, SiON, and low K) with no deposition on silicon surfaces that are hydrogen terminated.

SUMMARY

One or more embodiments of the disclosure are directed to methods of selective deposition. The methods comprise providing a substrate with a first material with a first surface and a second material with a second surface. The first material comprises silicon and the second material comprises a dielectric. The substrate is exposed to at least one radical initiator to activate the first surface. The substrate is exposed to a blocking compound comprising at least one blocking molecule to selectively deposit a blocking layer on the activated first surface relative to the second surface. The blocking molecule comprises a head group and a tail group, the head group comprising at least one alkene or alkyne moiety. A dielectric layer is formed selectively on the second surface relative to the first surface. The blocking layer contains a plurality of silicon-carbon bonds and inhibits deposition of the dielectric layer on the first surface.

Further embodiments of the disclosure are directed to a method of selective deposition. The method comprises providing a substrate with a first material with a first surface and a second material with a second surface. The first material consists essentially of silicon and the second material comprises silicon oxide ($SiO_2$). The substrate is exposed to a pretreatment to form a hydrogen terminated silicon layer on the first surface. The substrate is exposed to at least one radical initiator to activate the first surface. The substrate is exposed to a blocking compound comprising at least one blocking molecule to selectively deposit a blocking layer on the activated first surface relative to the second surface. At least one blocking molecule is 1,17-octadecadiene. The blocking layer is exposed to a polymerization agent to cross-link the blocking molecules and form a cross-linked blocking layer. A dielectric layer is formed selectively on the second surface relative to the first surface. The cross-linked blocking layer contains a plurality of silicon-carbon bonds and inhibits deposition of the dielectric layer on the first surface.

Further embodiments of the disclosure are directed to a method of selective deposition. The method comprises providing a substrate with a first material with a first surface and a second material with a second surface. The first material consists essentially of hydrogen terminated silicon and the second material comprises a dielectric. The substrate is exposed to a chemical catalyst and a SAM compound comprising at least one SAM molecule to selectively deposit a SAM layer on the first surface relative to the second surface. The SAM molecule comprises at least one carbonyl or imine moiety. A dielectric layer is formed selectively on the second surface relative to the first surface. The SAM layer contains a plurality of silicon-oxygen bonds or silicon-nitrogen bonds and inhibits deposition of the dielectric layer on the first surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
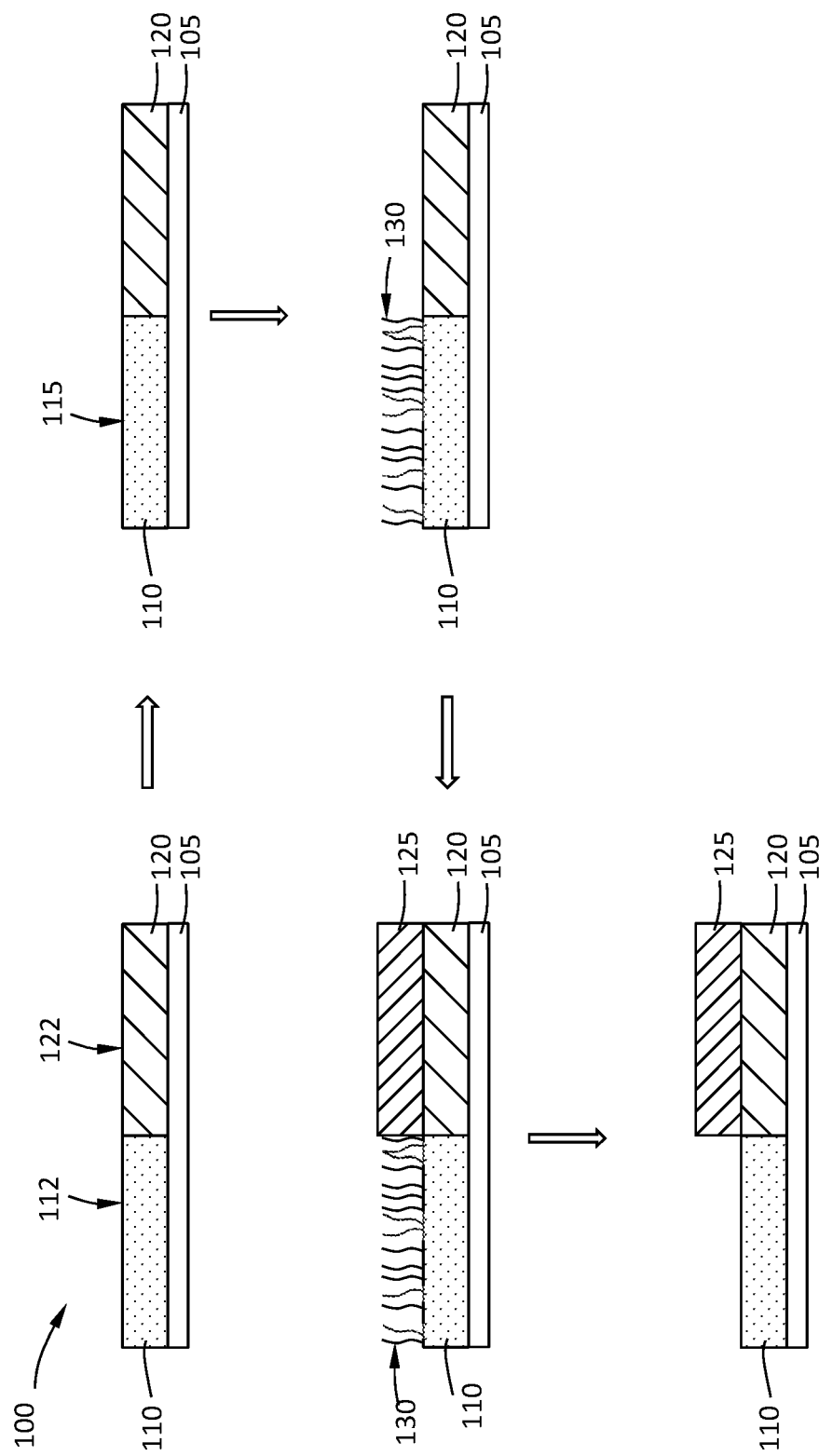
FIG. 1 illustrates a processing method in accordance with one or more embodiment of the disclosure.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the desired film thickness is achieved on the target substrate material with less or negligible deposition on the other substrate materials (where "negligible" is defined by process constraints).

Embodiments of the disclosure provide methods of selectively depositing a film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

One strategy to achieve selective deposition employs the use of blocking layers. Ideally, this strategy involves (1) formation of a blocking layer on substrate materials on which deposition is to be avoided with negligible impact to the target substrate material, (2) deposition on the target substrate material (where deposition on other substrate materials is "blocked" by the blocking layer), and (3) optional removal of the blocking layer without net adverse effects to the deposited film.

Embodiments of the disclosure incorporate a blocking layer, also referred to as a self-assembled monolayer (SAM). A self-assembled monolayer (SAM) consists of an ordered arrangement of spontaneously assembled organic molecules adsorbed on a surface. These molecules are typically comprised of one or more moieties with an affinity for the substrate (head group) and a relatively long, inert, linear hydrocarbon moiety (tail group).

In this case, SAM formation happens through fast adsorption of molecular head groups at the surface and slow association of molecular tail groups with each other through van der Waals interactions. SAM precursors, also known as blocking molecules are chosen such that the head group selectively reacts with the substrate materials to be blocked during deposition. Deposition is then performed, and the SAMs can be removed through thermal decomposition (with desorption of any byproducts) or an integration-compatible ashing process. Successful selective deposition through this idealized formation and use of SAMs has been demonstrated for a number of systems; however, success is essentially limited to a solution-based approach for SAM formation (i.e., wet functionalization). Wet functionalization approaches are not only incompatible with vacuum-based integration schemes but also often require sonication post-SAM formation to eliminate physisorbed SAM precursors. This suggests successful selective SAM formation (on one substrate versus another) cannot rely on the functionalization process alone to yield the overall selective chemisorption result with no physisorption.

Referring to FIG. 1, one or more embodiment of the disclosure is directed to a processing method 100 for selective deposition. A substrate 105 is provided with a first material 110 and a second material 120. The first material 110 has a first surface 112 and the second material 120 has a second surface 122.

In some embodiments, the first material comprises silicon. In some embodiments, the first material consists essentially of silicon. As used in this specification and the appended claims, the term "consists essentially of" means that greater than or equal to about 95%, 98% or 99% of the specified material is the stated material.

In some embodiments, the second material comprises a dielectric material. In some embodiments, the second material comprises silicon oxide, $SiO_2$, SiON, SiOC, SiN, or a low k dielectric. As used in this manner, a low k dielectric is a material that has a dielectric constant less than or equal to about 5. In some embodiments, the second material consists essentially of silicon dioxide.

In some embodiments, the first surface is hydrogen terminated. In some embodiments, the bonds on the surface of the first material are greater than 95, 97, 98, or 99 percent Si—H bonds.

In some embodiments, the substrate is exposed to a pretreatment to increase the prevalence of Si—H bonds on the first surface. Any suitable pretreatment may be used to increase the prevalence of Si—H bonds, including but not limited to, dipping the substrates in dilute HF or exposing the substrate to a thermal or plasma treatment.

Some embodiments of the disclosure provide methods of blocking or protecting an Si—H surface by hydrosilylation. Hydrosilylation is the reaction of Si—H bonds the alkenes and alkynes to form a silicon-carbon bond. Without being bound by theory, it is believed that treatment of the silicon substrate leads to formation of H terminated Si. A radical initiator activates the Si—H bond forming a H* radical at the Si—H surface. The radical can propagate and react with incoming unsaturated bonds to form a Si—C linkage. Hydrosilylation reactions are selective to Si—H bonds and do not react with Si—OH or Si—NH bonds. The addition of alkyl chains form a dense hydrophobic network, which can lead to repulsion of incoming ALD precursors to bind to H-terminated Si and grow dielectric on $SiO_2$ or SiN and not on Si—H surface.

From a mechanistic standpoint, the formation of the radical begins the hydrosilylation reaction. The radical initiator can be classified in three main categories: (1) photochemical initiation; (2) chemical initiation; and (3) plasma-based radical initiation. One or more radical initiators can be used to start the hydrosilylation process to block the Si—H surface selectively.

The first surface 112 is exposed to a radical initiator to activate the first surface. After being activated by the radical initiator, the first surface may be referred to as the activated first surface 115. The radical initiator can be any suitable process or combination of processes that promotes the formation of H* radicals on the first surface.

The activated first surface 115 is exposed to a blocking compound comprising at least one blocking molecule to selectively deposit a blocking layer 130 on the activated first surface 115 over the second surface 122. The blocking molecule comprises a head group and a tail group. As used in this manner, the "head group" is a chemical moiety that associates with the first surface 112 and the "tail group" is a chemical moiety that extends away from the first surface 112.

In some embodiments, the radical initiator is a photochemical initiator. In some embodiments, the photochemical initiator comprises exposing the substrate to ultraviolet or visible (UV-Vis) radiation to promote the formation of H* radicals on the first surface.

Figure 2:
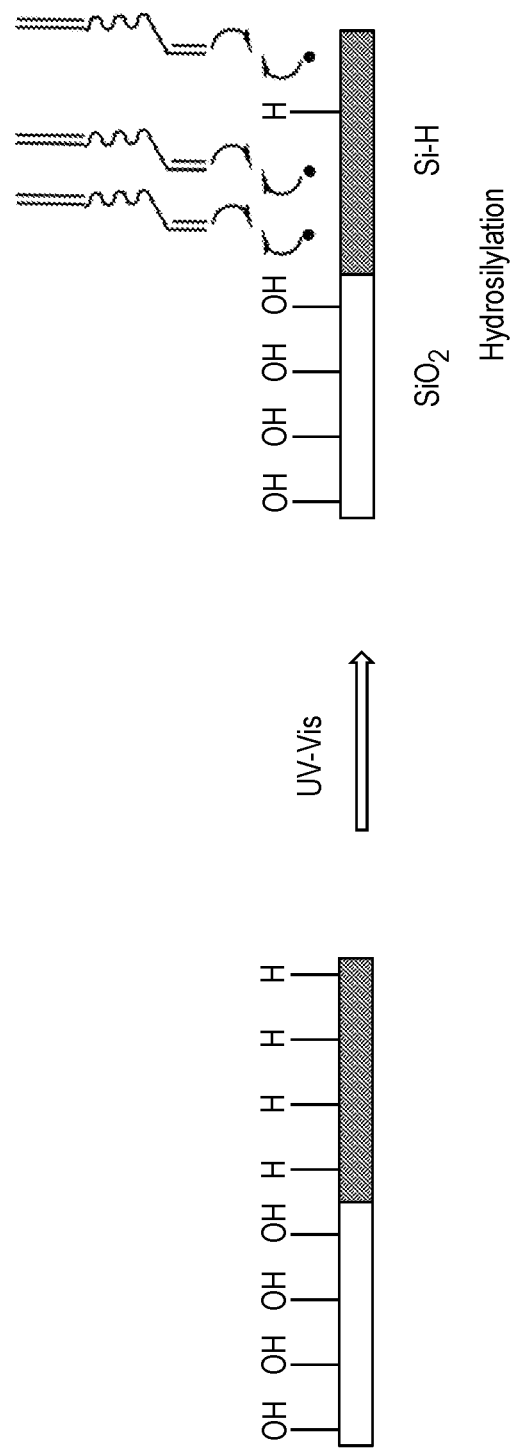
FIG. 2 illustrates an integration scheme in accordance with one or more embodiment of the disclosure.

FIG. 2 illustrates the used of photochemical energy for surface activation for hydrosilylation. Photochemical exposure of Si—H bonds leads to radical generation on Si—H surface. The radical can then propagate on the Si—H surface and form a Si—C bond through the alkene moiety.

The photochemical exposure of some embodiments comprises exposing the substrate to ultraviolet (UV) wavelengths. In some embodiments, the wavelengths are in the range of about 100 nm to about 350 nm. The photochemical exposure can occur at any suitable temperature in the range of about −50° C. to about 500° C., or in the range of about room temperature (25° C.) to about 400° C.

Figure 3:
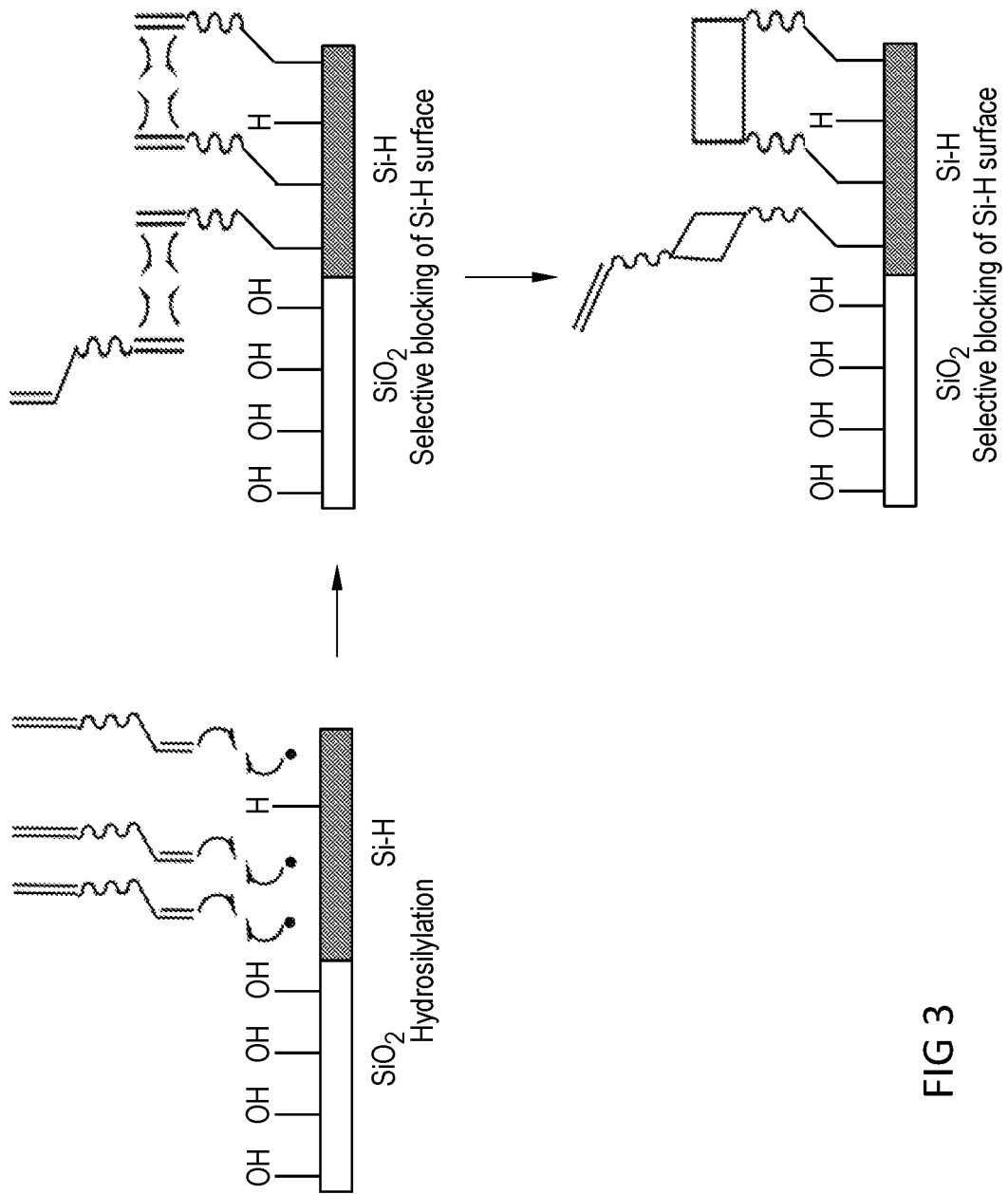
FIG. 3 illustrates an integration scheme in accordance with one or more embodiment of the disclosure.

In some embodiments, as illustrated in FIG. 3, a dialkene is used, which can result in a terminal alkene moiety after hydrosilylation. The terminal alkenes can cross-link with unsaturated bonds on the nearly SAM or a different alkene to form a dense network of carbon chains, which can inhibit growth of a layer on the Si—H surface.

In some embodiments, the radical initiator is a chemical initiator. Without being bound by any particular theory of operation, it is believed that free radicals on alkenes and alkynes can be generated by various chemical treatments. Non-limiting examples include peroxides (e.g., hydrogen peroxide, cumene peroxide, tert-butyl peroxide) and azo-based compounds (e.g., azobisisobutyronitrile (AIBN), 4,4'-azopyridine).

In some embodiments, the chemical initiator is a metal catalyst. In some embodiments, the chemical initiator is an organic catalyst. Without being bound by theory, in the case where the radical initiator comprises either the metal catalyst or the organic catalyst, the radical initiator may act to stabilize a radical-based reaction rather than promote the formation of H* radicals.

In some embodiments, the chemical initiator is a peroxide. In some embodiments, the peroxide comprises one or more of hydrogen peroxide, cumene peroxide or tert-butyl peroxide. In some embodiments, the chemical initiator consists essentially of hydrogen peroxide. In some embodiments, the chemical initiator consists essentially of cumene peroxide. In some embodiments, the chemical initiator consists essentially of tert-butyl peroxide. As used in this manner, the term "consists essentially of" means that the chemical initiator is greater than or equal to about 95%, 98% or 99% of the stated compound.

In some embodiments, the chemical initiator is an azo compound. In some embodiments, the azo compound comprises one or more of azobisisobutyronitrile (AIBN) or 4,4'-azopyridine. In some embodiments, the azo compound consists essentially of azobisisobutyronitrile (AIBN). In some embodiments, the azo compound consists essentially of 4,4'-azopyridine.

In some embodiments, the chemical initiator comprises a metal catalyst. In some embodiments, the metal catalyst comprises a metal selected from a rare earth metal, platinum, palladium, ruthenium or cobalt. In this regard, rare earth metals are the lanthanides, scandium and yttrium. In some embodiments, the chemical initiator comprises one or more of $Co_2(CO)_8$ or $CpCo(CO)_2$, where Cp is a substituted or unsubstituted cyclopentadienyl group. In some embodiments, the metal catalyst consists essentially of $Co_2(CO)_8$. In some embodiments, the metal catalyst consists essentially of $CpCo(CO)_2$.

Figure 4:
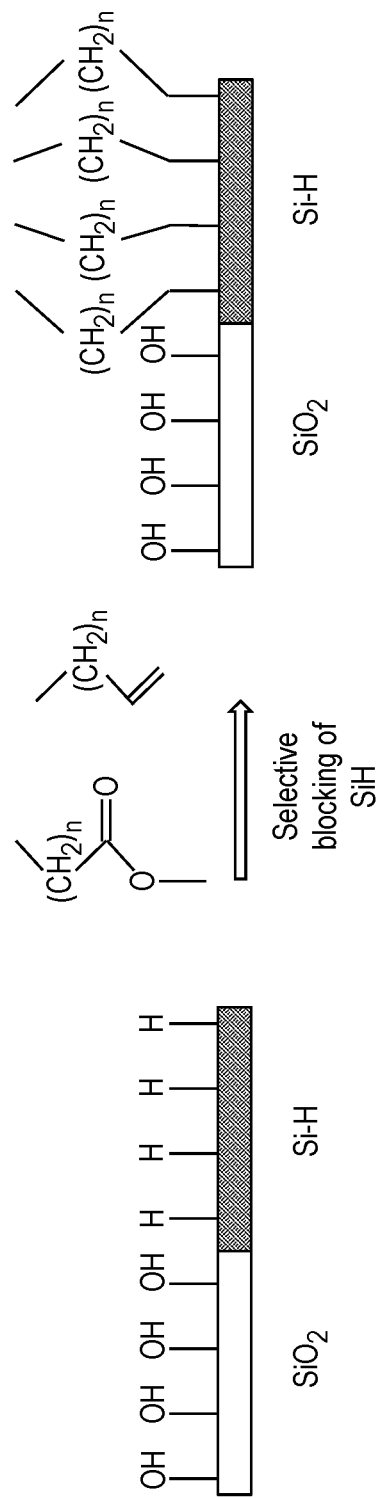
FIG. 4 illustrates an integration scheme in accordance with one or more embodiment of the disclosure.
Figure 5:
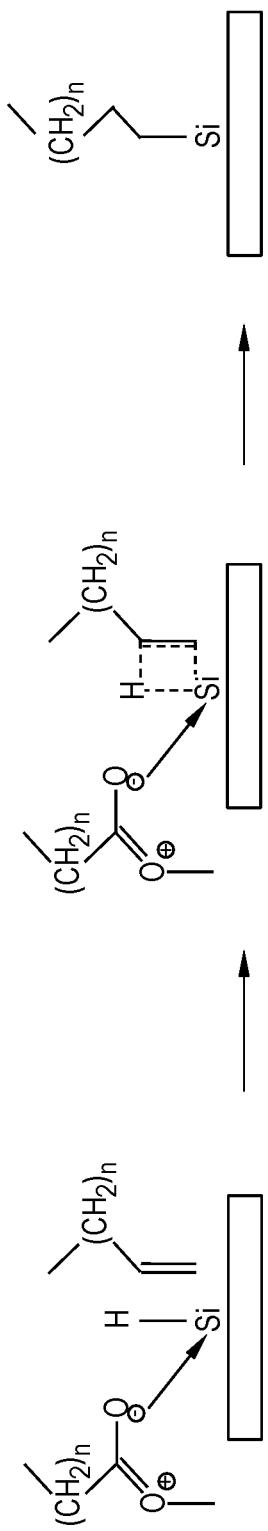
FIG. 5 illustrates an integration scheme in accordance with one or more embodiment of the disclosure.

Si—H on silicon surface can be activated by an acid or ester (the acid/ester act as a catalyst) and activated Si—H is susceptible for hydrosilylation with an alkene or alkyne. FIG. 4 shows the selective blocking of Si—H surface using ester and alkene. Without being bound by theory, it is believed that the reaction mechanism for this reaction is illustrated in FIG. 5. For acid (RCOOH), R can be linear chain hydrocarbon, or branched hydrocarbon, or aromatic. For ester (RCOOR'), R and R' can be linear chain hydrocarbon, or branched hydrocarbon, or aromatic. For alkene (R—C=C—H$_2$), R can be linear chain hydrocarbon, or branched hydrocarbon, or aromatic. For alkyne (R—C≡C—H), R can be linear chain hydrocarbon, or branched hydrocarbon, or aromatic. In some embodiments, the organic catalyst comprises an organic ester or an organic acid. In this regard, an organic ester has the general formula RCOOR' and an organic acid has the general formula RCOOH. R and R' can be any linear chain hydrocarbon, branched chain hydrocarbon or aromatic group.

In some embodiments, the radical initiator is a plasma-based initiator. In some embodiments, the plasma-based initiator comprises exposing the substrate to a plasma to promote the formation of H* radicals on the first surface. Free radicals on alkene and alkyne can also be generated by exciting the π electron of the unsaturated bond using thermal or plasma energy source.

In some embodiments, the plasma is generated using a remote plasma source. In some embodiments, the plasma power is less than or equal to about 300 W. In one or more embodiments, the plasma power is less than or equal to about 250 W, 200 W, 150 W, 100 W, 50 W or 25 W. In some embodiments, the plasma power is in the range of about 10 W to about 200 W, or in the range of about 25 W to about 175 W, or in the range of about 50 W to about 150 W.

Figure 6:
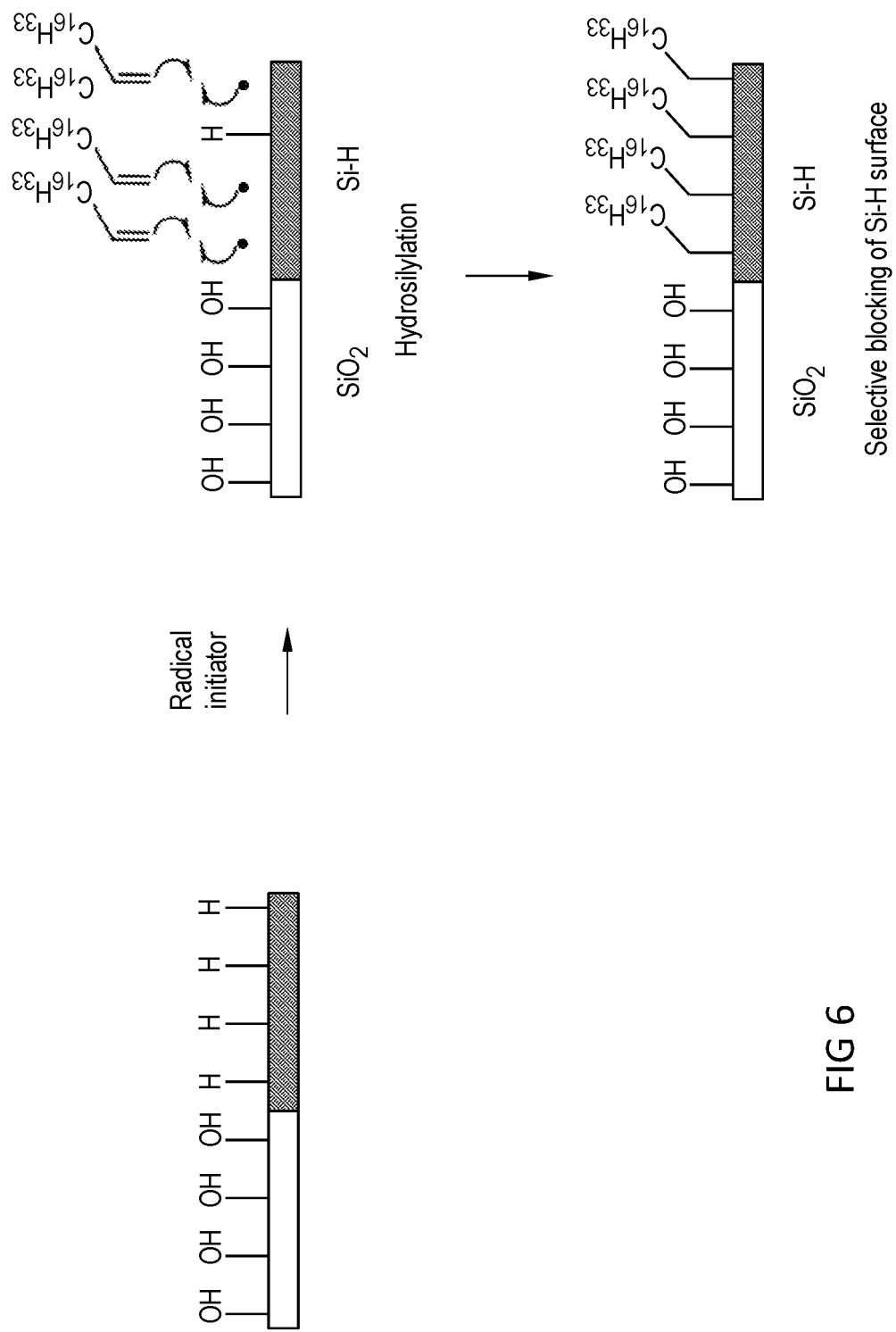
FIG. 6 illustrates an integration scheme in accordance with one or more embodiment of the disclosure.

The head groups of the blocking molecules can react with the H* radicals on the first surface to form Si—C bonds and alkyl silane chains bonded to the first surface according to FIG. 6.

In some embodiments, the head group comprises at least one alkene or alkyne moiety. In some embodiments, the tail group is a linear chain hydrocarbon, a branched hydrocarbon, or an aromatic moiety. In some embodiments, the blocking compound comprises 1-dodecene (CH$_2$=CHC$_{10}$H$_{21}$). In some embodiments, the blocking compound comprises 1-octadecene (CH$_2$=CHC$_{16}$H$_{33}$).

In some embodiments, the substrate is exposed to the radical initiator and the blocking compound simultaneously. In some embodiments, the substrate is exposed to the radical initiator and the blocking compound sequentially.

While not pictured in FIG. 1, in some embodiments, the tail group comprises at least one alkene or alkyne moiety and the blocking layer is exposed to a polymerization agent to cross-link the blocking molecules. The polymerization agent may be any suitable process which causes the unsaturated moieties in the tail groups of the blocking molecules to polymerize. In some embodiments, the polymerization agent comprises exposing the blocking layer to UV-Vis radiation.

The blocking compound can be delivered to the substrate as a single compound or sequential exposures of multiple compounds to form a blocking layer 130. In some embodiments, the first surface 112 is exposed to a single compound that assembles on the surface in an ordered or semi-ordered manner.

In some embodiments, the tail groups associate with each other through relatively slow van der Waals interaction. In some embodiments, the tail groups can be the same or different so that a homogeneous or heterogeneous SAM can be formed. In some embodiments, the blocking compound comprises at least two different blocking molecules so that a heterogenous SAM is formed.

In some embodiments, the radical initiator is replaced by a chemical catalyst and the blocking compound is replaced by a SAM compound. In some embodiments, the substrate is exposed to the chemical catalyst and the SAM compound sequentially. In some embodiments, the substrate is exposed to the chemical catalyst and the SAM compound simultaneously.

In some embodiments, the chemical catalyst comprises a Lewis acid. Lewis acids are species with unfilled or partially unfilled orbital in an outermost shell. Due to electron deficiency, Lewis acids can readily accept electron from Lewis bases to form an adduct. Electron deficiency enables Lewis acids to catalyze a variety of reactions, among which is the activation of Si—H bond to react with aldehyde, ketones, imines, etc. Trivalent boron compounds are one example of Lewis acid as boron has three electrons in 2P orbitals and after accepting 3 electrons from the ligand, total electrons involved in π bonding is six, which is two electrons short of the nearest octate configuration. Depending on electronegativity of the ligand, Lewis acidity of trivalent boron compounds varies. Tris(pentafluorophenyl)borane (B(C$_6$F$_5$)$_3$) is a strong Lewis acid which can selectively hydrosilylate Si—H bonds in presence of Si—OH moiety.

Suitable examples of Lewis acids include, but are not limited to, tris(pentafluorophenyl)borane, dichlorophenylborane and difluorophenylborane, as illustrated below.

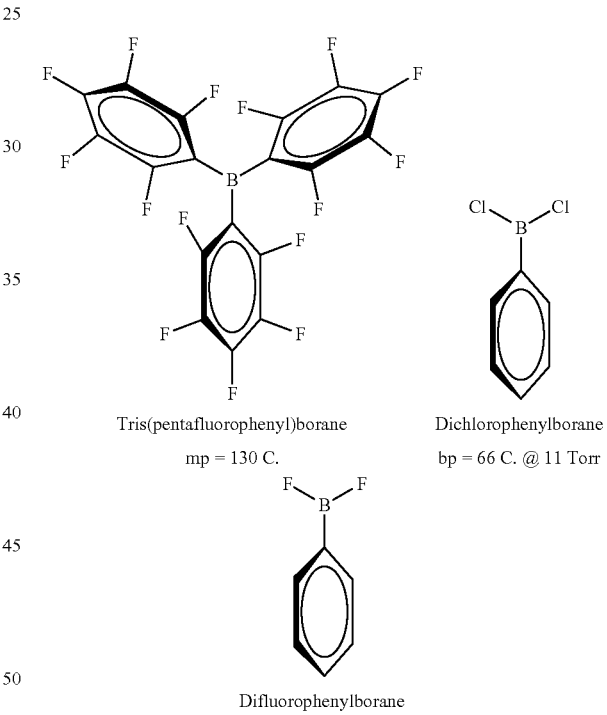

Tris(pentafluorophenyl)borane
mp = 130 C.

Dichlorophenylborane
bp = 66 C. @ 11 Torr

Difluorophenylborane

In some embodiments, the Lewis acid comprises one or more of tris(pentafluorophenyl)borane, dichlorophenylborane or difluorophenylborane. In some embodiments, the Lewis acid consists essentially of tris(pentafluorophenyl)borane. In some embodiments, the Lewis acid consists essentially of dichlorophenylborane. In some embodiments, the Lewis acid consists essentially of difluorophenylborane. As used in this manner, the term "consists essentially of" means that the species acting as a Lewis acid is greater than or equal to about 95%, 98% or 99% of the stated species on a molar basis.

Scheme (VI) illustrates a general mechanism for Si—H bond activation by B(C$_6$F$_5$)$_3$ to react with ketones and imines

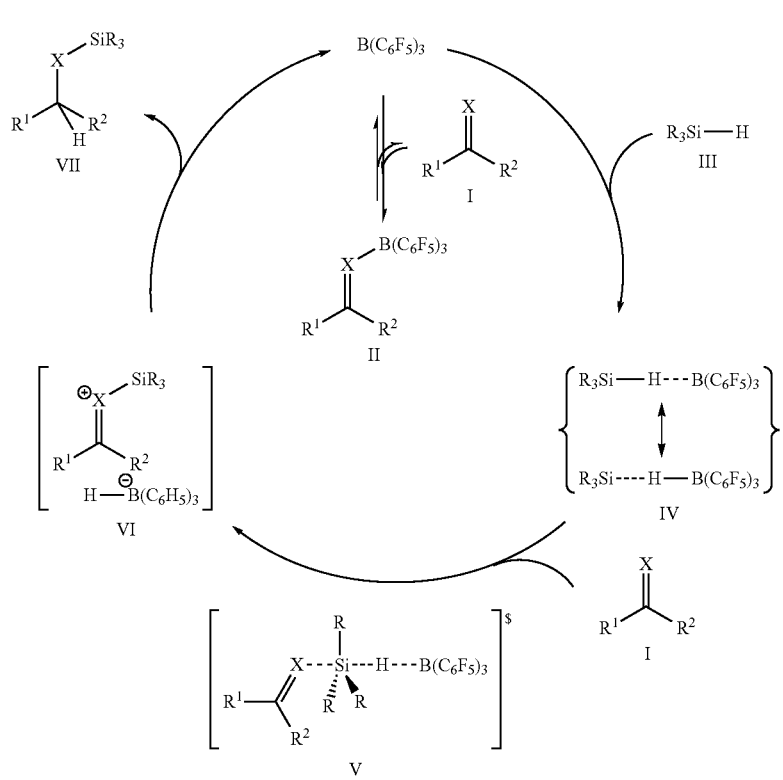

(VI)

In some embodiments, the chemical catalyst comprises one or more of tris(pentafluorophenyl)borane, dichlorophenylborane, or difluorophenylborane. In some embodiments, the chemical catalyst consists essentially of tris(pentafluorophenyl)borane.

Tris(pentafluorophenyl)borane catalyzed hydrosilylation of ketones and imines can occur at room temperature. Boron-based Lewis acids can be used to selectively hydrosilylate Si—H surface with ketones and imines to form a protective layer, which will enable deposition of a dielectric on $SiO_2$ but not on Si—H surface. Examples of suitable ketones/aldehyde and imines include, but are not limited to, undecanal, octanal, 2-undecanone, 2-octanone, benzophenone imine and 2,2,4,4-tetramethyl-3-pentanone imine.

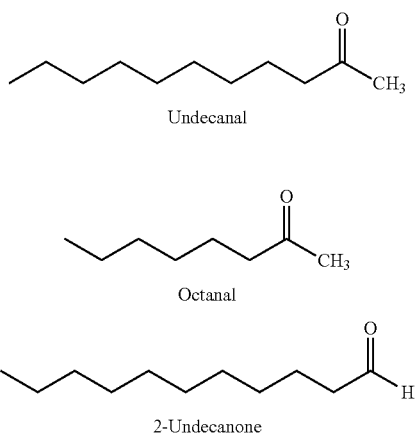

Undecanal

Octanal

2-Undecanone

-continued

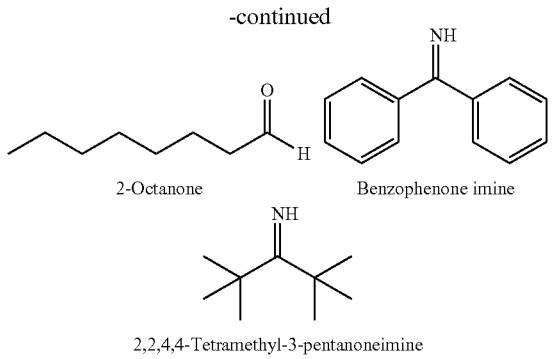

2-Octanone

Benzophenone imine 2,2,4,4-Tetramethyl-3-pentanoneimine

Figure 7:
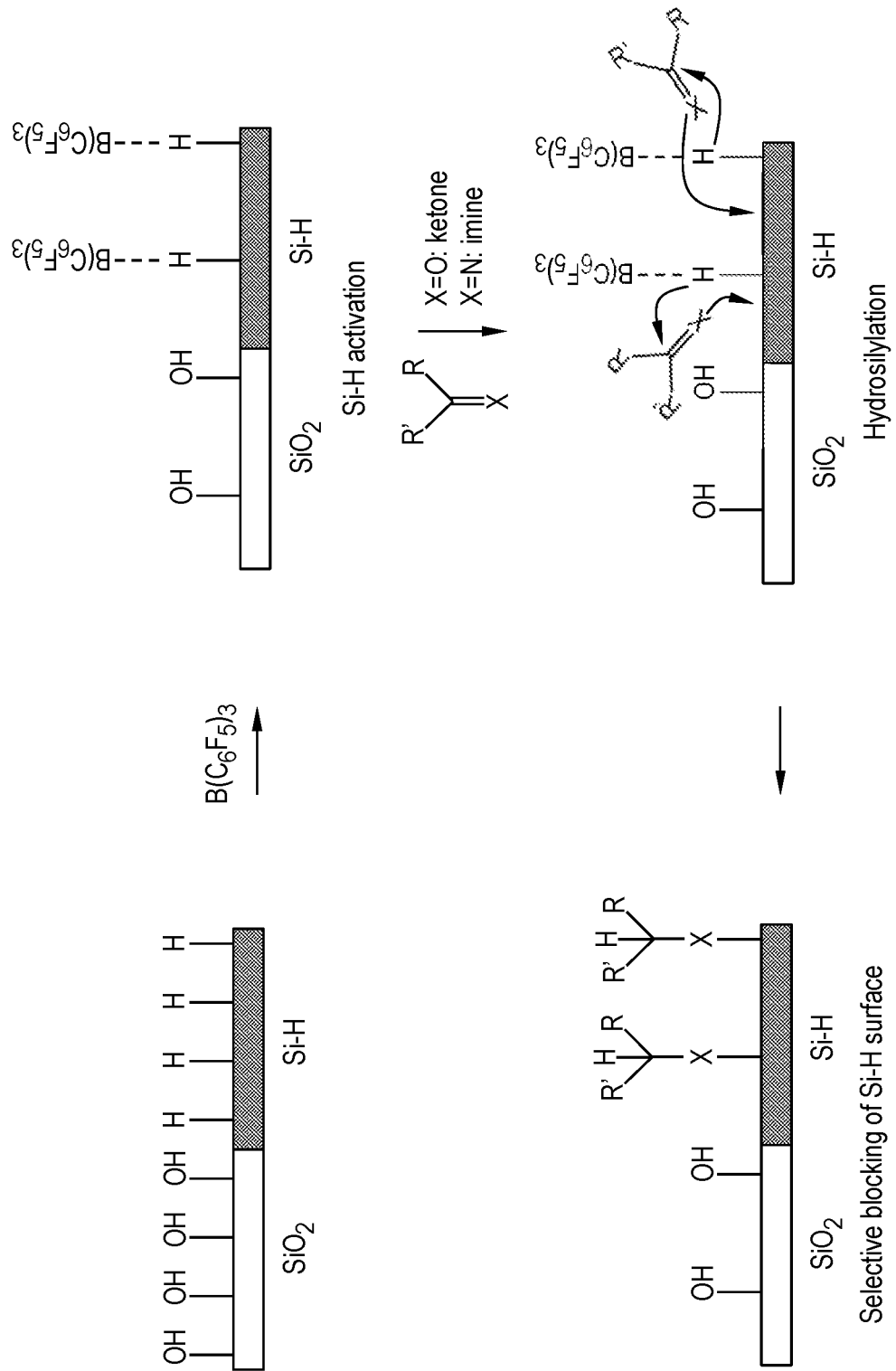
FIG. 7 illustrates an integration scheme in accordance with one or more embodiment of the disclosure.

FIG. 7 illustrates a typical process sequence to selectivity block Si—H surface using Lewis acid catalyzed hydrosilylation.

In some embodiments, the SAM compound comprises at least one SAM molecule. In some embodiments, the SAM molecule comprises at least one carbonyl (C=O) or imine (C=N) moiety. In some embodiments, the imine moiety is a primary imine moiety (C=NH). In some embodiments, the iminie moiety is a secondary imine moiety (C=NR).

In some embodiments, the SAM molecule comprises a carbonyl and the SAM molecule is an aldehyde. In some embodiments, the SAM molecule comprises a carbonyl and the SAM molecule is a ketone. In some embodiments, the SAM molecule comprises an imine and the SAM molecule is an aldimine. In some embodiments, the SAM molecule comprises an imine and the SAM molecule is a ketimine.

Exposures to the radical initiator can occur at any suitable temperature. In some embodiments, the temperature of the substrate during exposure to a chemical initiator is in the range of about 100 QC to about 500 QC.

In some embodiments, the radical initiator is generated in a gaseous species flowing across a hot filament, also referred to as a hot wire. The temperature of the hot wire can be in the range of about 100 QC to about 1500 QC. The gaseous species can be any suitable species including a generally reactive species or a generally inert species. A generally inert species includes $H_2$, $N_2$, He, Ar, Ne, Kr and Xe.

After formation of the blocking layer 130, a dielectric layer 125 is selectively formed on the second surface 122 of the second material 120 over the blocking layer 130. The blocking layer 130 provides a protecting group to prevent or minimize deposition of the dielectric layer 125 on the first surface 112. In some embodiments, the dielectric layer 125 is a different material than the second material 120. In some embodiments, the dielectric layer 125 is the same material as the second material 120.

In some embodiments, after selective deposition of the dielectric layer 125 on the second material 120, the blocking layer 130 is removed from the first surface. The blocking layer may be removed from the first surface by any suitable means. In some embodiments, the blocking layer 130 is removed from the surface by oxidation. In some embodiments, the blocking layer 130 is etched from the surface. In some embodiments, the blocking layer 130 is dissolved in a suitable solvent (e.g., ethanol).

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of selective deposition comprising:
   providing a substrate with a first material with a first surface and a second material with a second surface, the first material consisting essentially of a hydrogen terminated silicon and the second material comprising a dielectric;
   exposing the substrate to at least one radical initiator to activate the first surface;
   exposing the substrate to a blocking compound comprising at least one blocking molecule to selectively deposit a blocking layer on the activated first surface relative to the second surface, the blocking molecule comprising a head group and a tail group, the head group comprising at least one alkene or alkyne moiety; and
   forming a dielectric layer selectively on the second surface relative to the first surface,
   wherein the blocking layer contains a plurality of silicon-carbon bonds and inhibits deposition of the dielectric layer on the first surface.

2. The method of claim 1, further comprising exposing the substrate to a pretreatment to form a hydrogen terminated silicon layer on the first surface.

3. The method of claim 1, wherein the second material comprises silicon oxide ($SiO_2$), silicon nitride (SiN), silicon oxynitirde (SiON), or a low-k dielectric.

4. The method of claim 1, wherein the radical initiator is selected from a photochemical initiator, a thermal initiator, a plasma-based initiator or a chemical initiator.

5. The method of claim 4, wherein the chemical initiator comprises a peroxide, an azo compound, a metal catalyst or an organic catalyst.

6. The method of claim 5, wherein the peroxide is selected from hydrogen peroxide, cumene peroxide or tert-butyl peroxide.

7. The method of claim 5, wherein the azo compound is selected from azobisisobutyronitrile (AIBN) or 4,4'-azopyridine.

8. The method of claim 5, wherein the metal catalyst comprises a metal selected from a rare earth metal, Pt, Pd, Ru or Co.

9. The method of claim 8, wherein the metal catalyst comprises $Co_2(CO)_8$.

10. The method of claim 5, wherein the organic catalyst comprises an organic ester or an organic acid.

11. The method of claim 1, wherein the tail group is a linear chain hydrocarbon, a branched hydrocarbon, or an aromatic moiety.

12. The method of claim 1, wherein the tail group comprises at least one alkene or alkyne moiety and further comprising exposing the blocking layer to a polymerization agent to cross-link the blocking molecules.

13. The method of claim 1, wherein more than one radical initiator is used.

14. The method of claim 1, wherein the blocking compound comprises 1-dodecene ($CH_2=CHC_{10}H_{21}$).

15. The method of claim 1, wherein the blocking compound comprises 1-octadecene ($CH_2=CHC_{16}H_{33}$).

16. A method of selective deposition comprising:
    providing a substrate with a first material with a first surface and a second material with a second surface, the first material consisting essentially of silicon and the second material comprising silicon oxide ($SiO_2$);
    exposing the substrate to a pretreatment to form a hydrogen terminated silicon layer on the first surface;
    exposing the substrate to at least one radical initiator to activate the first surface;
    exposing the substrate to a blocking compound comprising at least one blocking molecule to selectively deposit a blocking layer on the activated first surface relative to the second surface, at least one blocking molecule is 1,17-octadecadiene;
    exposing the blocking layer to a polymerization agent to cross-link the blocking molecules and form a cross-linked blocking layer; and
    forming a dielectric layer selectively on the second surface relative to the first surface,
    wherein the cross-linked blocking layer contains a plurality of silicon-carbon bonds and inhibits deposition of the dielectric layer on the first surface.

17. A method of selective deposition comprising:
    providing a substrate with a first material with a first surface and a second material with a second surface, the first material consisting essentially of hydrogen terminated silicon and the second material comprising a dielectric;
    exposing the substrate to at least one chemical catalyst to activate the first surface;
    exposing the substrate to a self-assembled monolayer (SAM) compound comprising at least one SAM molecule to selectively deposit a SAM layer on the activated first surface relative to the second surface, the SAM molecule comprising at least one carbonyl or imine moiety; and
    forming a dielectric layer selectively on the second surface relative to the first surface, wherein the SAM layer contains a plurality of silicon-oxygen bonds or silicon-nitrogen bonds and inhibits deposition of the dielectric layer on the first surface.

18. The method of claim 17, wherein the chemical catalyst comprises tris(pentafluorophenyl)borane.

19. The method of claim 17, wherein the SAM compound comprises one or more of undecanal, octanal, 2-undecanone, 2-octanone, benzophenone imine or 2,2,4,4-tetramethyl-3-pentanone imine.

20. The method of claim 17, wherein the chemical catalyst comprises a Lewis acid.

* * * * *

UNITED STATES PATENT AND TRADEMARK OFFICE
CERTIFICATE OF CORRECTION

PATENT NO. : 11,371,136 B2
APPLICATION NO. : 16/647794
DATED : June 28, 2022
INVENTOR(S) : Bhaskar Jyoti Bhuyan et al.

It is certified that error appears in the above-identified patent and that said Letters Patent is hereby corrected as shown below:

In the Specification

•Column 10, Line 56, after "the", before 'moiety', replace "iminie" with "imine".

In the Claims

•Column 11, Claim 3, Line 3, before '(SiON)', replace "oxynitirde" with "oxynitride".

Signed and Sealed this
Thirtieth Day of August, 2022

Katherine Kelly Vidal
*Director of the United States Patent and Trademark Office*